(12) United States Patent
Kahlert et al.

(10) Patent No.: US 6,192,328 B1
(45) Date of Patent: Feb. 20, 2001

(54) METHOD AND CONFIGURATION FOR COMPUTER-AIDED DETERMINATION OF A SYSTEM RELATIONSHIP FUNCTION

(75) Inventors: Martin Kahlert, Karpfenhofen; Jörg-Uwe Feldmann; Utz Wever, both of München, all of (DE)

(73) Assignee: Infineon Technologies AG, Munich (DE)

(*) Notice: Under 35 U.S.C. 154(b), the term of this patent shall be extended for 0 days.

(21) Appl. No.: 09/225,137

(22) Filed: Jan. 4, 1999

Related U.S. Application Data

(63) Continuation of application No. PCT/DE97/01231, filed on Jun. 17, 1997.

(30) Foreign Application Priority Data

Jul. 4, 1996 (DE) .............................................. 196 26 984

(51) Int. Cl.[7] .................................................. G06F 9/455
(52) U.S. Cl. .................................................. 703/2; 716/4
(58) Field of Search ............................ 703/2, 6, 13, 14; 700/67, 30; 706/20, 907; 716/4, 20

(56) References Cited

U.S. PATENT DOCUMENTS

| | | | |
|---|---|---|---|
| 5,148,379 | * 9/1992 | Konno et al. | 716/20 |
| 5,313,398 | 5/1994 | Rohrer et al. | 703/14 |
| 5,349,541 | * 9/1994 | Alexandro et al. | 703/18 |
| 5,379,231 | 1/1995 | Pillage et al. | 703/14 |
| 5,537,329 | * 7/1996 | Feldmann et al. | 716/4 |
| 5,629,845 | * 5/1997 | Liniger | 700/67 |
| 5,692,158 | * 11/1997 | Degeneff et al. | 703/2 |
| 5,781,764 | * 7/1998 | Degeneff et al. | 703/2 |
| 6,023,573 | * 2/2000 | Bai et al. | 703/2 |

FOREIGN PATENT DOCUMENTS 0 690 396 A1   1/1996   (EP) .

OTHER PUBLICATIONS

H. Chiang et al., Stability of Nonlinear Systems Described by a Second–Order Vector Differential Equation, IEEE Transactions on Circuits and Systems, vol. 35, No. 6, Jun. 1988, pp. 703–711.*

J. Zhu et al., A Unified Eigenvalue Theory for Time–Varying Linear Circuits and Systems, IEEE International Symposium on Circuits and Systems, 1990, pp. 1393–1397, vol. 2.*

K. Huper et al., A Class of Lossless Nonlinear Dynamical Systems Computing Eigenvalues, IEEE International Symposium on Circuits and Systems, ISCAS '92, Proceedings, 1992, vol. 4, pp. 1636–1639.*

E. Lindberg et al., An Eigenvalue Study of the MLC Circuit, 1998 IEEE International Conference on Electronics, Circuits and Systems, vol. 2, 1998, pp. 521–524.*

(List continued on next page.)

*Primary Examiner*—Kevin J. Teska
*Assistant Examiner*—Russell W. Frejd
(74) *Attorney, Agent, or Firm*—Herbert L. Lerner; Laurence A. Greenberg; Werner H. Stemer

(57) ABSTRACT

A system relationship function is defined which describes the "external response" of a set of coupled linear components in an electrical circuit. A differential equation system is defined for the set of coupled linear components, and a predetermined number of eigenvalues are determined for the homogeneous differential equation system. An error is indicated for the eigenvalues which is caused by ignoring those eigenvalues which have not been determined within the homogeneous differential equation system. If the error is less than a given setpoint error, then the system relationship function is produced from the differential equations which are described by the determined eigenvalues. If the error is greater than the limit, then further eigenvalues are determined, for which an error is in turn determined. This method is continued iteratively until the error is less than the limit.

12 Claims, 3 Drawing Sheets

OTHER PUBLICATIONS

"A Preconditioned Jacobi–Davidson Method For Solving Large Generalized Eigenvalue Problems" (Booten et al.), Report NM–R9414, ISSN 0169–0388, Amsterdam, pp. 1–18.

"Computer Methods For Circuit Analysis And Design" (Vlach et al.) Van Nostrand Reinhold Electrical/Computer Science and Engineering Series, pp. 208–234.

"RICE: Rapid Interconnect Circuit Evaluation Using AWE" (Ratzlaff et al.), IEEE Transactions on Computer–Aided Design of Integrated Circuits and Systems, vol. 13, No. 6, Jun. 1994, pp. 763–776.

"New Methods For Delay Time Calculation in Semi–Custom Circuits" (Glashoff et al.), Informatik in der Praxis, Springer, ISBN 3–540–17054, 1986, pp. 13–26.

* cited by examiner

METHOD AND CONFIGURATION FOR COMPUTER-AIDED DETERMINATION OF A SYSTEM RELATIONSHIP FUNCTION

CROSS-REFERENCE TO RELATED APPLICATION

This is a continuation of copending international application PCT/DE97/01231, filed Jun. 17, 1997, which designated the United States.

BACKGROUND OF THE INVENTION

Field of the Invention

Due to the fact that the integration density of electrical circuits is becoming ever greater (VLSI), it is becoming more and more complex to determine system states of an electrical circuit, for example by means of a circuit simulation. The integration densities attained in modern circuits are already so great that even parasitic effects, for example crosstalk effects between lines which connect the individual components of the electrical circuit to one another, must be considered. The lines are normally modeled as linear components, for example as a sequence of RC elements. If the integration density is high, the additional modeling of lines leads to an increased number of sets of mutually coupled linear components within an electrical circuit, which are in each case coupled to non-linear components of the electrical circuit. Expressed figuratively, this results in "islands" of mutually coupled linear components of an electrical circuit that is to be investigated.

The large number of coupled linear components which are caused, for example, by modeling the parasitic effects in the lines subject the computers that are used in the investigation of the individual electrical circuits to requirements which cannot be satisfied at the moment, even by very high-performance computers.

A so-called eigenvalue solver for determining eigenvalues for a homogeneous differential equation system is known from Booten et al., "A Preconditioned Jacobi-Davidson Method for Solving Large Generalized Eigenvalue Problems," Report NM-R9414, Centrum voor Wiskunde en Informatica, Netherlands, ISSN-0169-0388 (1994).

The determination of a transfer function for a set of coupled linear components is described in Vlach and Singhal, "Computer Methods for Circuit Analysis and Design," Van Nostrand Reinhold Company, New York, ISBN-0-442-28108-0 (1983).

A process is known for the approximation of a transfer function for a set of coupled linear components of an electrical circuit, in which only the so-called dominant eigenvalue is considered. See Glashoff and Merten, "Neue Verfahren zur Laufzeitberechnung bei Semi-Custom-Schaltungen," [New Methods for Delay Time Calculation in Semi-Custom Circuits]; Informatik in der Praxis, Springer, ISBN 3-540-17054-5, p. 13–26 (1986).

A plurality of transfer functions can be determined separately for a set of linear components. The transfer functions thus each describe the response of the set of linear components with respect to two reference connections for the respective transfer function. This is described by Ratzlaff and Pillage, "RICE: Rapid Interconnect Circuit Evaluation Using AWE," IEEE Transactions on Computer-Aided Design of Integrated Circuits and Systems, Vol. 13, No. 6, pp. 763–76, June 1994.

The method described by Vlach and Singhal has the disadvantage that, there, only the state of the set of linear components is considered, and only with respect to two connections of the set of linear components to non-linear components. It is not possible to use that method to consider a greater number of connections to further non-linear components.

The method described by Ratzlaff and Pillage has the disadvantage, inter alia, that, although a number of connections of the set of linear components to linear components are considered, these are, however, in each case always only in pairs. On the one hand, therefore, this requires increased computation capacity for carrying out the method and, on the other hand, the accuracy of the results which are achieved by that method is very low.

SUMMARY OF THE INVENTION

It is accordingly an object of the invention to provide a method and configuration for computer-aided determination of a system relationship function, which overcomes the above-mentioned disadvantages of the heretofore-known devices and methods of this general type and which describes a set of coupled linear components of an electrical circuit which has any number of non-linear components and linear components, the set of coupled linear components being coupled to any number of non-linear components, which can be carried out more quickly and whose results provide more accurate statements than the prior art methods about the system state of the set of linear components.

With the foregoing and other objects in view there is provided, in accordance with the invention, a method for computer-aided determination of a system relationship function describing a set of coupled linear components of an electrical circuit with an arbitrary number of non-linear components and linear components, the method which comprises the following steps:

a) defining a differential equation system with equations for a set of coupled linear components;

b) determining a predeterminable number of eigenvalues for a homogeneous differential equation system of the differential equation system;

c) determining an error for the eigenvalues with respect to an error criterion obtained by ignoring all the eigenvalues of the homogeneous differential equation system;

d) determining whether the error is less than a predetermined limit;

e) if the error is not less than the limit, defining further eigenvalues and repeating the method steps b) to d) with the further eigenvalues until the error is less than the limit;

f) if the error is less than the limit, defining the system relationship function from the equations of the differential equation system described by the determined eigenvalues; and g) outputting the system relationship function describing the set of coupled linear components of the electrical circuit.

In other words, a differential equation system, which represents a state description of the set of coupled linear components, is defined for the set of coupled linear components which is embedded in any number of non-linear components. A given number of eigenvalues are determined for the homogeneous differential equation system of the differential equation system, and an error is defined for the eigenvalues which is caused by ignoring the remaining eigenvalues of the homogeneous differential equation system. If the error is less than a predetermined limit, the system relationship function is produced from those equations of the differential equation system which are described by the determined eigenvalues. However, if the error is greater than the predetermined limit, further eigenvalues are determined for the homogeneous differential equation system, and the error is once again estimated, until the error is less than the limit.

The method achieves a considerable savings in computation time since the individual "islands" of mutually coupled linear components, that is to say the set of coupled linear components, can be calculated quickly and in a simple manner and can then be considered further as a so-called black box, which is described by the system relationship function, for any number of connections to non-linear components in the electrical circuit.

Furthermore, a considerable advantage of the method according to the invention is that it is now possible to determine any number of connections, that is to say connections of the set of coupled linear components to non-linear components or else to further linear components which are ignored in the set, for any reason.

The increased accuracy of the results achieved in the determination of the system relationship function is also a considerable advantage.

Furthermore, the method makes it possible to carry out circuit simulations for circuits with very large scale integration, despite taking into account parasitic effects on lines.

In accordance with an added feature of the invention, the eigenvalues are determined in a sequence of their information content with respect to the error criterion. In other words, it is advantageous if the eigenvalues are determined in values which, with respect to their information content, fall with respect to the error criterion, that is to say in such a manner that eigenvalues with a high information content are determined at the start, and eigenvalues with only a low information content with respect to the error criterion are determined at the end.

This procedure increases the accuracy of the results, that is to say the accuracy of the system relationship function, with respect to the set of coupled linear components, since those eigenvalues which have a low information content are ignored.

In accordance with an additional feature of the invention, the eigenvalues are determined in a sequence of falling magnitude of the eigenvalues. As a result, the determination of the eigenvalues is further simplified. The method can thus be carried out more quickly, which leads to a considerable saving in computation time when carrying out the method.

In accordance with another feature of the invention, the error criterion is defined by a delay time error resulting from ignoring eigenvalues.

In accordance with a further feature of the invention, the system relationship function describes electrical currents flowing between connections of a set of coupled linear components and non-linear components.

In accordance with again an added feature of the invention, the system relationship function further describes differentiations of the electrical currents between connections of the set of coupled linear components and the non-linear components.

In accordance with again another feature of the invention, the linear components are provided by electrical resistances, and/or electrical capacitances, and/or electrical inductances.

In accordance with a concomitant feature of the invention, the non-linear components are provided by transistors.

With the above and other objects in view there is also provided, in accordance with the invention, a configuration for determining a system relationship function describing a set of coupled linear components of an electrical circuit with an arbitrary number of non-linear components and linear components. The configuration has a computer unit comprising:

a device for determining a differential equation system for a set of coupled linear components of an electrical circuit;

a device for determining a predetermined number of eigenvalues for a homogeneous differential equation system of the differential equation system;

a device for determining an error with respect to an error criterion obtained by ignoring all the eigenvalues of the homogeneous differential equation system;

a checking device for checking whether the error is less than a predetermined limit, whereby if the error is not less than the predetermined limit, the device for determining the eigenvalues defines further eigenvalues until the error is less than the limit, and if the error is less than the predetermined limit, the system relationship function is defined from those equations of the differential equation system which are described by the determined eigenvalues.

In accordance with again a concomitant feature of the invention, the eigenvalue determining device is programmed to determine the eigenvalues in a sequence of their information content with respect to the error criterion or in a sequence of falling magnitude of the eigenvalues.

Although the invention is illustrated and described herein as embodied in method and configuration for computer-aided determination of a system relationship function, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
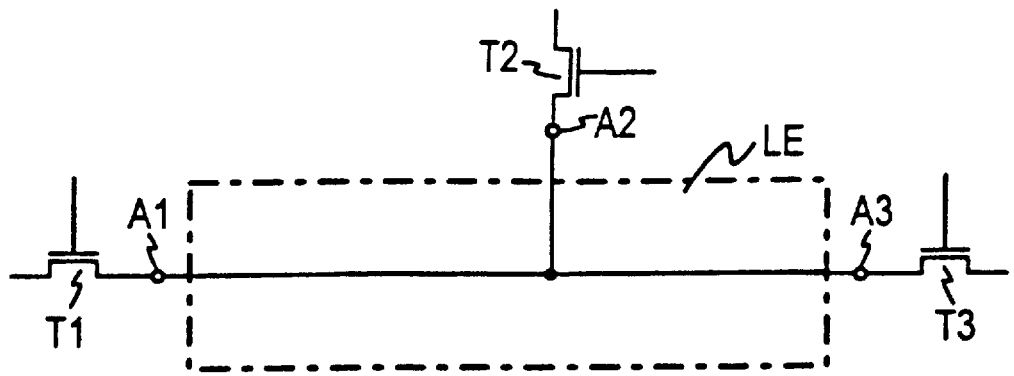
FIGS. 1A and 1B are sketches of a very simple exemplary circuit, in which a line (FIG. 1A) is modeled as a set of coupled linear components (FIG. 1B)
Figure 1B:
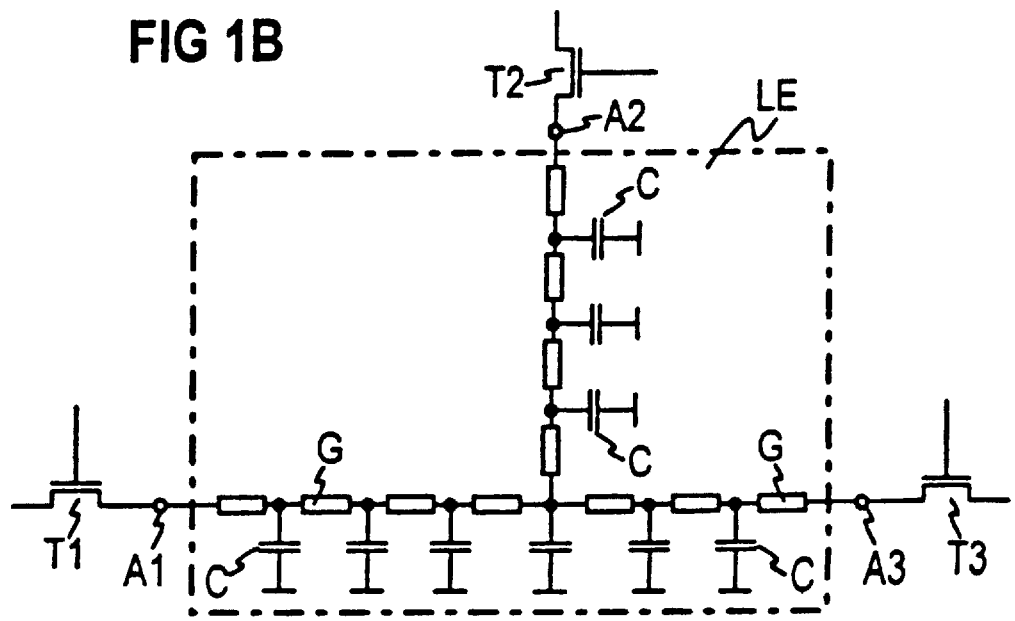

Referring now to the figures of the drawing in detail and first, particularly, to FIGS. 1A and 1B thereof, there is seen a very simple exemplary circuit in FIG. 1A with three transistors T1, T2, T3, that are coupled to one another via a line LE and via three connections A1, A2, A3.

This very simple example of FIG. 1A is used only to provide a better illustration of the method according to the invention. However, it will be readily understood by those of skill in the pertinent art that the general validity and general applicability of the method are not limited in any way by the simple example.

FIG. 1B illustrates a set of coupled linear components which is used to model the line LE with its parasitic effects that have to be considered in a very large scale integration density. The parasitic effects are considered when determining a state of the electrical circuit having a large scale integration density.

It becomes amply clear even from the simple exemplary circuit that considering the parasitic effects in the line LE results in a very large number of linear, mutually coupled components. In the general case, of course, a large number of non-linear components, such as, for example, the transistors T1, T2, T3, are coupled to one another, and a large number of lines LE also have to be modeled. Thus, in the case of an electrical circuit having a large scale integration density, the method can be applied to a large number of sets of coupled linear components as a result of which a large number of lines LE are considered and investigated.

In the following text, the term linear components means, for example, pure resistances R ($R=1/G$), linear capacitances C or else linear inductances L. The term non-linear components means, for example, any types of non-linear electronic components, for example transistors.

However, the method can be used not only for determining a system relationship function which describes a set of coupled linear components by modeling parasitic effects of lines LE in circuits with a very large scale integration density, but can also be used for all electrical circuits in which a set of coupled linear components occur which are coupled via connections to non-linear components. Furthermore, it is unnecessary for the set of coupled linear components to be coupled exclusively to non-linear components. Further linear components may likewise be connected to the connections of the set of coupled linear components.

The object of the invention is to determine a system relationship function for the set of coupled linear components which indicates as quickly and accurately as possible the system response for the set of coupled linear components at the connections, the connections A1, A2 and A3 in FIG. 1B, with an error that is as small as possible.

The number of connections is not crucial in the method and may be arbitrary. In general, the electrical circuit has both linear components and non-linear components. It should be stressed that there must be no non-linear components in the set of coupled linear components.

In generally formulated form, the following problem to be solved is obtained for determining a system relationship function which describes the system response:

$$\underline{j} = \underline{C} \cdot \frac{d\underline{U}}{dt} + \underline{G} \cdot \underline{U} \tag{1}$$

In this case, C is a capacitance matrix, G is a conductance matrix, and U is a vector of the node potentials of all the nodes of a linear relationship component, that is to say the set of coupled linear components. The capacitance matrix C and the conductance matrix G may also contain contributions from elements which have only one linear node in the set of coupled linear components. The capacitance matrix C and the conductance matrix G are both positive semidefinite. If the set of coupled linear components has a total of r connections, which are also called boundary nodes and are admittedly "non-linear" but are connected via a linear component to a "linear" node, and a total of n inner nodes, then the capacitance matrix C and the conductance matrix G have the dimension nxr.

The elements $(C_R)_{i,k}$ of a boundary capacitance matrix $C_R$ with dimensionality $R^{n \times r}$ become $$(C_R)_{i,k} = w \tag{2}$$

if a boundary node, i.e., a connection k, is coupled via a capacitor C of capacitance w to an inner node i.

The elements $(G_R)_{i,k}$ of a boundary conductance matrix $G_R$ of dimensionality $R^{n \times r}$ become $$(G_R)_{i,k} = \frac{1}{R} \tag{3}$$

if a connection k is coupled via a resistance R to an inner node i. R is the resistance of the resistor R.

If the nomenclature introduced above is used, a boundary current vector j. is obtained which flows through the respective connections, for example A1, A2, A3 in FIG. 1B, from the following expression:

$$\underline{j} = \underline{C}_R \cdot \frac{d\underline{U}_R}{dt} + \underline{G}_R \cdot \underline{U}_R \tag{4}$$

In this case, $U_R$ are boundary potentials, i.e., the potentials of the boundary nodes (connections).

An imaginary conductance matrix B becomes, using an imaginary angular frequency σ, $$B = G + \sigma \cdot C \tag{5}$$

If the imaginary angular frequency signal a is chosen to be greater than zero and is chosen in such a manner that the imaginary conductance matrix B can be inverted, that is to say is positive definite, an auxiliary matrix A becomes:

$$A = (G + \sigma \cdot C)^{-1} \cdot C = B^{-1} \cdot C \tag{6}$$

After a number of conversion operations, equation (1) can be rewritten in the following form:

$$\underline{A} = \frac{d\underline{U}}{dt} + (\underline{1} - \sigma \cdot \underline{A}) \cdot \underline{U} = B^{-1} \cdot \underline{j} \tag{7}$$

where 1 is a unit matrix.

After further conversion operations, and using the following substitutions $$U = W \cdot d \tag{8}$$

and $$W^T \cdot B \cdot A \cdot W = \Lambda \tag{9}$$

then $$\Lambda \cdot \frac{d\underline{d}}{dt} + (\underline{1} - \sigma \cdot \Lambda) \cdot \underline{d} = \underline{W}^T \cdot \underline{j} \tag{10}$$

Where W is a matrix of dimension $R^{n \times n}$, which includes the eigenvectors $w_i$ of the respective differential equation system. The vector d is an $R^n$-dimensional vector which includes the transformed variables of the differential equation system. The equations above correspond to the normal procedure for so-called main axis transformation for "decoupling" (diagonalising) the variables of a differential equation system.

This represents an eigenvalue problem, whose solution is determined by an eigenvalue solver which is known, for example, from Booten et al., supra.

An eigenvalue matrix $\Lambda$ is a diagonal matrix with the eigenvalues to be determined.

Figure 2:
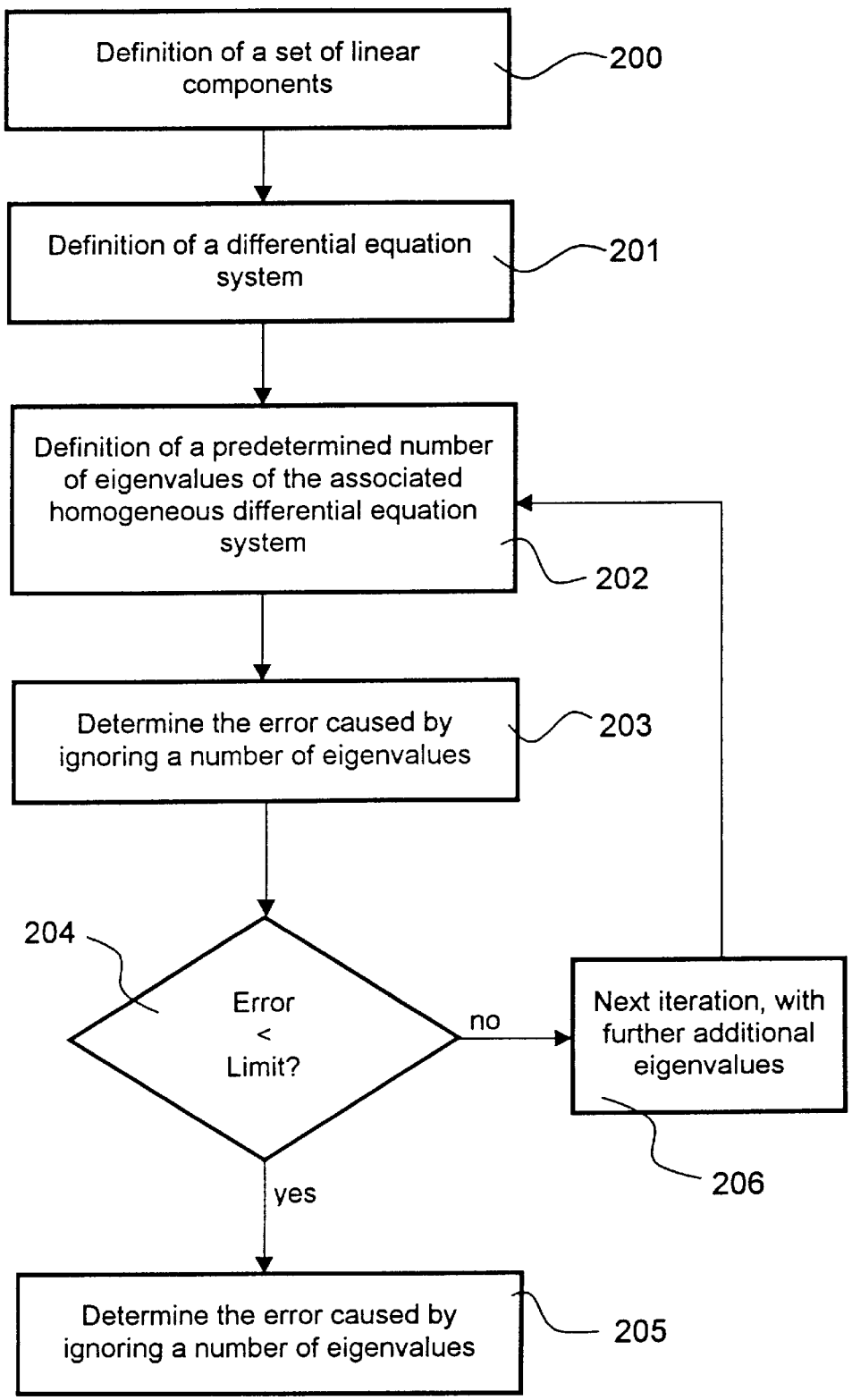
FIG. 2 is a flowchart illustrating the individual method steps of the invention.

Reference will now be had to FIG. 2, which illustrates the method with the following method steps:

After defining the set of coupled linear components to be processed 200, a differential equation system which describes the respective set of coupled linear components is defined 201 for the set of coupled linear components to be investigated. This corresponds to the definition of state equations for the set of coupled linear components. Since the differential equation system is subject to a stimulus f(t,U), which is dependent not only on the time t but also on the node potentials U of the set of coupled linear components, solving this problem is highly complex.

In a second step 202, a predetermined number of eigenvalues $\lambda$ are now determined for the homogeneous differential equation system of the differential equation system, with the aid of an eigenvalue solver. Any number of eigenvalues $\lambda$ may be determined. Once the predetermined portion of the eigenvalues $\lambda$ of the homogeneous differential equation system has been determined, an error estimation function, which is illustrated by way of example in the following text, is used to determine, in general form and using a predetermined error criterion, an error which results from the fact that the eigenvalues $\lambda$, which have not been determined at this stage, of the homogeneous differential equation system are ignored in the state description.

A very wide range of application aspects may play a role as the error criterion. In this simple exemplary embodiment, a delay time error is used by way of example as the error criterion, this error being produced by ignoring a number of eigenvalues $\lambda$ in the state representation of the set of coupled linear components. A phase error $\Delta t$, after the electrical circuit has completed any transient process, becomes $$\Delta t = \frac{\lambda}{1-\sigma\cdot\lambda} \quad (11)$$

The delay time error as the error criterion corresponds to the phase error $\Delta t$ illustrated here. The desired or required accuracy of the system relationship function which describes the set of coupled linear components may be predetermined by the user. For example, for the predetermined number of determined eigenvalues $\lambda$, the error is determined in accordance with the following expression 203:

For the special case in which the eigenvalues $\lambda_1, \lambda_2, \ldots, \lambda_k$ are determined in falling magnitude in terms of their information content, the method provides for the following inequality to be checked for a predetermined tolerance Tol:

$$\frac{\lambda_k}{1-\sigma\cdot\lambda_k} > Tol\cdot\frac{\lambda_1}{1-\sigma\cdot\lambda_1}$$

This special case means that the eigenvalue $\lambda_1$ has a greater information content than the eigenvalue $\lambda_2$ the eigenvalue $\lambda_2$ has a greater information content than the eigenvalue $\lambda_3$, etc.

One possible value for the tolerance Tol is, for example, 0.1. However, the tolerance Tol is completely application-specific and can be predetermined freely.

If the error is less than a predetermined limit, which corresponds to the desired or required accuracy which can be set by the user, this being checked in a further step 204, then the system relationship function is obtained from the equations of the differential equation system, which are described by the eigenvalues $\lambda$ determined up to this point in time.

For the special case described above, the limit is implicitly included in the tolerance Tol.

If, however, the error is greater than the predetermined limit 204, then the accuracy of the system relationship function must be further increased, this being achieved by further determination of eigenvalues $\lambda$ for the homogeneous differential equation system 202, redefinition of the error 203 and rechecking as to whether the error is less than the predetermined limit 204. These steps 202, 203, 204 are repeated until the error, with respect to the error criterion, is less than the limit 205.

A development of the method provides for the eigenvalues $\lambda$ to be defined in a sequence by first determining eigenvalues $\lambda$ having a high information content with respect to the error criterion, and eigenvalues $\lambda$ having a low information content with respect to the error criterion not being determined until later. This results in the eigenvalues $\lambda$ determined first having the highest information content with respect to the error criterion, and thus in the eigenvalues $\lambda$ which are not ignored causing a minimal possible error in the system relationship function.

For the special case in which the error criterion can be seen in the delay time error, it is advantageous to define the sequence of definition of the eigenvalues in such a manner that the eigenvalues $\lambda$ are determined, and organized as well, on the basis of falling magnitude. This is a result of the fact that, with delay time error as the error criterion, the maximum eigenvalues $\lambda$, that is to say the eigenvalues $\lambda$ which have the greatest value, also have the greatest information content with respect to delay time error as the error criterion.

Thus, in this case, the eigenvalues $\lambda$ are determined in the sequence of falling magnitude of the eigenvalues $\lambda$.

A development of the method provides for the system relationship function to be an equation system which describes the electrical currents flowing through the connections, that is to say the electrical currents which flow between the connections of the set of coupled linear components and the non-linear components. These correspond to the currents in the simple example in FIGS. 1A and 1B, which flow through the connections A1, A2, A3.

For the case in which the determined error is less than the limit, the system relationship function is obtained as follows 205:

$$I = \underline{C}\frac{T}{R}\cdot\left(Q\cdot\frac{d\underline{U}_R}{dt} - \frac{d\underline{U}}{dt}\right) + \underline{G}\frac{T}{R}\cdot(P\cdot\underline{U}_R - \underline{U}) \quad (12)$$

T is in each case a transposed matrix. I is a boundary node current vector which describes the currents which flow through the connections.

P is a matrix of dimension $R^{n \times r}$, whose elements $P_{i,k}$ have the value 1 when a boundary node k is coupled via a resistance R to a node i. Q is a matrix of dimension $R^{n \times r}$ whose elements $Q_{i,k}$ have the value 1 when a boundary node k is coupled via a capacitor C to a node i.

This system relationship function describes the state of the set of linear components at the connections, for example A1, A2, A3, by which means, the system response of the electrical circuit can be defined quickly, with a small error, by ignoring a number of eigenvalues $\lambda$.

Furthermore, a development of the method provides, in addition, for the differentials of the system relationship function, which describes the individual currents, to be considered on the basis of the boundary node potentials $U_R$.

In this case, equations are additionally determined on the basis of the expression $$\frac{\partial I}{\partial \underline{U}_R} \tag{13}$$

This determination may be carried out by using numeric or closed integration methods of any type, in the case of numerical integration methods, for example, by numerical integration by means of the trapezoidal rule or using the Euler method (explicit or implicit).

Figure 3:
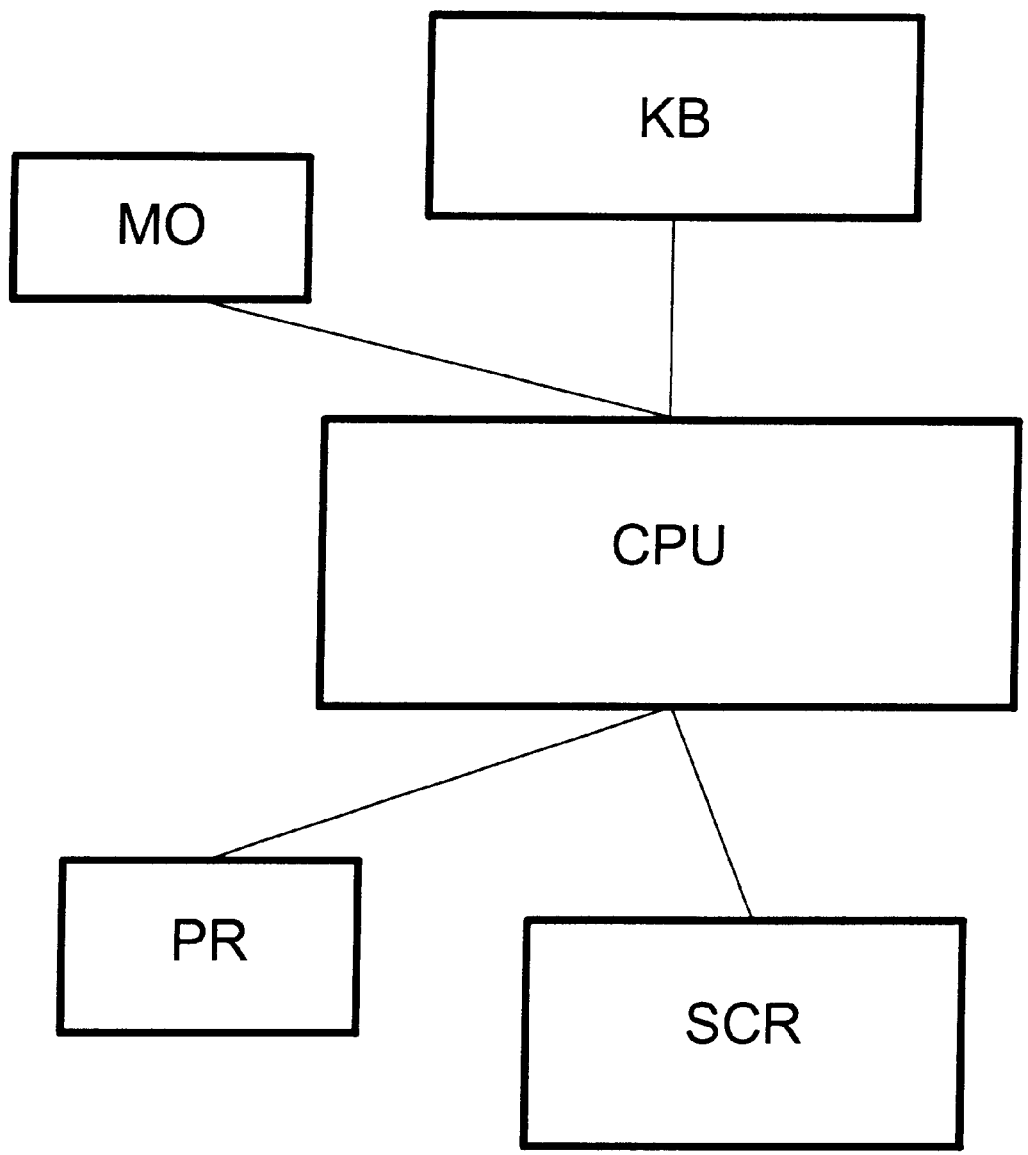
FIG. 3 is a block diagram of a computer configuration for carrying out the method.

FIG. 3 illustrates a computer configuration required to carry out the novel method. The computer configuration has a computer CPU and, in addition, for example a mouse MO and/or a keyboard KB for the user to enter any desired values. Furthermore, the computer configuration includes, for example, output means, for example a screen SCR which may also be implemented as a touch screen, or a printer PR.

The disclosures of the following publications, which are cited in the introduction above, are all incorporated by reference:

(1) J. G. Booten et al, A Preconditioned Jacobi-Davidson Method for Solving Large Generalized Eigenvalue Problems, Report NM-R9414, ISSN 0169-0388, CWI, P.O. Box 1090 GB, Amsterdam, Netherlands, pages 1–17, 1995

(2) J. Vlach und K. Singhal, Computer Methods for Circuit Analysis and Design, ISBN 0-442-28108-0, Van Nostrand Reinhold Electrical, pages 208–234, 1983

(3) K. Glashoff und K. Merten, Neue Verfahren zur Laufzeitberechnung bei Semi-Custom-Schaltungen, Informatik in der Praxis (New Methods for Delay Time Calculation in Semi-Custom Circuits, Information Practice), Springer Verlag, ISBN3-540-17054-5, pages 13–26, 1986

(4) C. L. Ratzlaff und L. T. Pillage, RICE: Rapid Interconnect Circuit Evaluation Using AWE, IEEE Transactions on Computer-Aided Design of Integrated Circuits and Systems, Vol. 13, No. 6, pages 763–776, June 1994

We claim:

1. A computer-aided method for determining a system state of an electrical circuit with non-linear components and linear components, the method which comprises the following steps:
   a) defining a differential equation system with equations for a set of coupled linear components;
   b) determining a predeterminable number of eigenvalues for a homogeneous differential equation system of the differential equation system;
   c) determining an error for the eigenvalues with respect to an error criterion obtained by ignoring all the eigenvalues of the homogeneous differential equation system;
   d) determining whether the error is less than a predetermined limit;
   e) if the error is not less than the limit, defining further eigenvalues and repeating the method steps b) to d) with the further eigenvalues until the error is less than the limit;
   f) if the error is less than the limit, defining the system relationship function from the equations of the differential equation system described by the determined eigenvalues; and
   g) outputting the system relationship function as an indication of the state of the set of coupled linear components at the connections of the electrical circuit.

2. The method according to claim 1, wherein the step of determining the eigenvalues comprises determining the eigenvalues in a sequence of their information content with respect to the error criterion.

3. The method according to claim 1, wherein the step of determining the eigenvalues comprises determining the eigenvalues in a sequence of falling magnitude of the eigenvalues.

4. The method according to claim 1, which comprises defining the error criterion by a delay time error resulting from ignoring eigenvalues.

5. The method according to claim 1, wherein the linear components are selected from the group consisting of electrical resistances, electrical capacitances, and electrical inductances.

6. The method according to claim 1, wherein the non-linear components are provided by transistors.

7. A computer-aided method for describing electrical currents flowing between connections of a set of coupled linear components and non-linear components, the method which comprises the following steps:
   a) defining a differential equation system with equations for a set of coupled linear components;
   b) determining a predeterminable number of eigenvalues for a homogeneous differential equation system of the differential equation system;
   c) determining an error for the eigenvalues with respect to an error criterion obtained by ignoring all the eigenvalues of the homogeneous differential equation system;
   d) determining whether the error is less than a predetermined limit;
   e) if the error is not less than the limit, defining further eigenvalues and repeating the method steps b) to d) with the further eigenvalues until the error is less than the limit;
   f) if the error is less than the limit, defining the system relationship function from the equations of the differential equation system described by the determined eigenvalues; and
   g) outputting the system relationship function as an indication of the state of the set of coupled linear components at the connections of the electrical circuit.

8. A computer-aided method for describing differentiations of the electrical currents in an electrical circuit with linear components and non-linear components, the method which comprises the following steps:
   a) defining a differential equation system with equations for a set of coupled linear components;
   b) determining a predeterminable number of eigenvalues for a homogeneous differential equation system of the differential equation system;
   c) determining an error for the eigenvalues with respect to an error criterion obtained by ignoring all the eigenvalues of the homogeneous differential equation system;
   d) determining whether the error is less than a predetermined limit;

e) if the error is not less than the limit, defining further eigenvalues and repeating the method steps b) to d) with the further eigenvalues until the error is less than the limit;

f) if the error is less than the limit, defining the system relationship function from the equations of the differential equation system described by the determined eigenvalues; and g) outputting the system relationship function as an indication of the state of the set of coupled linear components at the connections of the electrical circuit.

9. In a configuration for determining a system state of coupled linear components of an electrical circuit with an arbitrary number of non-linear components and linear components, a computer unit comprising:

a device for determining a differential equation system for a set of coupled linear components of an electrical circuit;

a device for determining a predetermined number of eigenvalues for a homogeneous differential equation system of the differential equation system;

a device for determining an error with respect to an error criterion obtained by ignoring all the eigenvalues of the homogeneous differential equation system;

a checking device for checking whether the error is less than a predetermined limit, whereby
if the error is not less than the predetermined limit, said device for determining the eigenvalues defines further eigenvalues until the error is less than the limit, and
if the error is less than the predetermined limit, the system relationship function is defined from those equations of the differential equation system which are described by the determined eigenvalues, and an output device for outputting the system relationship function as an indication of the state of the set of coupled linear components at the connections of the electrical circuit.

10. The configuration according to claim 9, wherein said device for determining the eigenvalues is programmed to determine the eigenvalues in a sequence of their information content with respect to the error criterion.

11. The configuration according to claim 9, wherein said device for determining the eigenvalues is programmed to determine the eigenvalues in a sequence of falling magnitude of the eigenvalues.

12. A configuration for determining a system state of coupled linear components of an electrical circuit having an arbitrary number of non-linear components and linear components, comprising:

a computer having an output device, said computer being programmed to:
define a differential equation system with equations for a set of coupled linear components;
determine a number of eigenvalues for a homogeneous differential equation system of the differential equation system;
determine an error for the eigenvalues with respect to an error criterion obtained by ignoring all the eigenvalues of the homogeneous differential equation system;
determine whether the error is less than a predetermined limit;
if the error is not less than the limit, define further eigenvalues and repeat the process with the further eigenvalues until the error is less than the limit;
if the error is less than the limit, define the system relationship function from the equations of the differential equation system described by the determined eigenvalues; and
output the system relationship function as an indication of the state of the set of coupled linear components at the connections of the electrical circuit on said output device.

* * * * *